US011796883B2

(12) United States Patent
Conklin et al.

(10) Patent No.: US 11,796,883 B2
(45) Date of Patent: Oct. 24, 2023

(54) INTEGRATED PHOTOVOLTAIC AND ELECTROCHROMIC WINDOWS

(71) Applicant: SolarWindow Technologies, Inc., Scottsdale, AZ (US)

(72) Inventors: John Anthony Conklin, Apalachin, NY (US); Scott Ryan Hammond, Wheat Ridge, CO (US)

(73) Assignee: SolarWindow Technologies, Inc., Scottsdale, AZ (US)

( * ) Notice: Subject to any disclaimer, the term of this patent is extended or adjusted under 35 U.S.C. 154(b) by 352 days.

(21) Appl. No.: 16/563,467

(22) Filed: Sep. 6, 2019

(65) Prior Publication Data

US 2020/0209700 A1 Jul. 2, 2020

Related U.S. Application Data

(63) Continuation of application No. 15/475,789, filed on Mar. 31, 2017, now Pat. No. 10,416,519, which is a
(Continued)

(51) Int. Cl.
*G02B 19/00* (2006.01)
*G02B 26/02* (2006.01)
(Continued)

(52) U.S. Cl.
CPC .............. *G02F 1/163* (2013.01); *G02F 1/157* (2013.01); *H01L 31/0488* (2013.01);
(Continued)

(58) Field of Classification Search
CPC ...... G02F 1/163; G02F 1/157; G02F 1/13318; G02F 2001/1502; H01L 31/0488;
(Continued)

(56) References Cited

U.S. PATENT DOCUMENTS 5,377,037 A 12/1994 Branz et al.
5,384,653 A 1/1995 Benson et al.
(Continued)

FOREIGN PATENT DOCUMENTS

EP 0669012 A4 10/1995

OTHER PUBLICATIONS

Evelyn A. Lester, National Search Report U.S. Appl. No. 14/079,909 dated Mar. 24, 2016.
(Continued)

*Primary Examiner* — Robert E. Tallman
(74) *Attorney, Agent, or Firm* — Schwegman Lundberg & Woessner, P.A.

(57) ABSTRACT

A variety of methods for integrating an organic photovoltaic-based SolarWindow™ module and electrochromic materials to create dynamic, variable transmittance, energy-saving windows and/or window films are described. Stand-alone or building integrated, independent or user-controllable, battery supported or building integrated, and insulated glass unit or aftermarket film implementations are all described, providing for a diversity of applications. Low-cost fabrication options also allow for economical production.

24 Claims, 7 Drawing Sheets

Related U.S. Application Data continuation of application No. 14/079,909, filed on Nov. 14, 2013, now Pat. No. 9,618,820.

(60) Provisional application No. 61/726,490, filed on Nov. 14, 2012.

(51) Int. Cl.
*G02F 1/163* (2006.01)
*H01L 31/048* (2014.01)
*G02F 1/157* (2006.01)
 *G02F 1/15* (2019.01)
 *G02F 1/133* (2006.01)

(52) U.S. Cl.
 CPC .......... *G02B 19/0042* (2013.01); *G02B 26/02* (2013.01); *G02F 1/13318* (2013.01); *G02F 2001/1502* (2013.01); *Y02B 10/10* (2013.01); *Y02E 10/50* (2013.01)

(58) Field of Classification Search
 CPC .... G02B 19/0042; G02B 26/02; Y02B 10/10; Y02E 10/50
 See application file for complete search history.

(56) References Cited

U.S. PATENT DOCUMENTS

| | | | |
|---|---|---|---|
| 6,055,089 A | 4/2000 | Schulz et al. | |
| 6,297,900 B1* | 10/2001 | Tulloch | E06B 9/24 359/275 |
| 8,188,361 B2 | 5/2012 | Huang | |
| 9,618,820 B2 | 4/2017 | Conklin et al. | |
| 10,401,701 B2 | 9/2019 | Conklin et al. | |
| 10,416,519 B2 | 9/2019 | Conklin et al. | |
| 2008/0169185 A1 | 7/2008 | Burdis et al. | |
| 2011/0108116 A1* | 5/2011 | Kang | H01L 51/4253 136/263 |
| 2011/0286071 A1 | 11/2011 | Huang et al. | |
| 2012/0194895 A1 | 8/2012 | Podbelski et al. | |
| 2013/0100675 A1* | 4/2013 | Han | F21V 33/006 362/253 |
| 2014/0198371 A1 | 7/2014 | Conklin et al. | |
| 2018/0017836 A1 | 1/2018 | Conklin et al. | |
| 2018/0017837 A1 | 1/2018 | Conklin et al. | |

OTHER PUBLICATIONS

Q.L. Song et al., Small-molecule organic solar cells with improved stability, Chemical Physics Letters 416 (2005) 12-46, www.sciencedirect.com, In final form Sep. 12, 2005, Available on-line Oct. 6, 2005.

Evelyn A. Lester, National Search Report U.S. Appl. No. 15/475,789 dated Jun. 28, 2018.

"U.S. Appl. No. 15/475,765, Preliminary Amendment filed Oct. 11, 2017", 3 pages.

"U.S. Appl. No. 15/475,765, Non Final Office Action dated Jun. 29, 2018", 7 pages.

"U.S. Appl. No. 15/475,765, Response filed Dec. 31, 2018 to Non Final Office Action dated Jun. 29, 2018", 10 pages.

"U.S. Appl. No. 15/475,765, Notice of Allowance dated Apr. 18, 2019", 7 pages.

"U.S. Appl. No. 15/475,789, Response filed Dec. 28, 2018 to Non Final Office Action dated Jun. 28, 2018", 12 pages.

"U.S. Appl. No. 15/475,789, Notice of Allowance dated May 8, 2019", 7 pages.

"U.S. Appl. No. 14/079,909, Response filed Sep. 26, 2016 to Non Final Office Action dated Mar. 24, 2016", 11 pages.

"U.S. Appl. No. 14/079,909, Restriction Requirement dated Jun. 11, 2015", 7 pages.

"U.S. Appl. No. 14/079,909, Response filed Dec. 10, 2015 to Restriction Requirement dated Jun. 11, 2015", 6 pages.

"U.S. Appl. No. 14/079,909, Notice of Allowance dated Nov. 30, 2016", 9 pages.

* cited by examiner

INTEGRATED PHOTOVOLTAIC AND ELECTROCHROMIC WINDOWS

CROSS-REFERENCE TO RELATED APPLICATIONS

The present invention is a Continuation Application under 35 U.S.C. § 120 of U.S. patent application Ser. No. 15/475,789, filed Mar. 31, 2017, now allowed, which is a Continuation Application under 35 U.S.C. § 120 of U.S. patent application Ser. No. 14/079,909, filed Nov. 14, 2013, now U.S. Pat. No. 9,618,820, issued Apr. 11, 2017, which claims the benefit of U.S. Provisional Patent Application No. 61/726,490, filed Nov. 14, 2012, and entitled "INTEGRATED PHOTOVOLTAIC AND ELECTROCHROMIC WINDOWS", the entire contents of which are incorporated herein by reference in their entirety.

FIELD OF THE INVENTION

The present invention is directed to the integration of a photovoltaic window, in the form of SolarWindow™, and an electrochromic window, in the generic form, to produce an energy-saving integrated dynamic window unit, and more particularly, to specific methods for implementing such an integration to maximize the benefits and minimize the disadvantages of the two technologies when implemented independently.

BACKGROUND OF THE INVENTION

SolarWindow™ is a novel photovoltaic window technology, based upon organic photovoltaics, that is the subject of several separate patent filings. This technology has numerous benefits when implemented independently, including the ability to generate power yet retain a high level of visible light transmission (VLT) in an attractive window application. This technology also allows the absorption of infrared (IR) light, thereby reducing the solar heating of buildings and individuals inside the buildings, increasing user comfort and decreasing building HVAC costs.

One limitation of the SolarWindow™ technology, however, is the static nature of its VLT; on a very bright, sunny day the total amount of visible light transmitted is greater than on darker/cloudier days, since the percentage of VLT does not change. As a result, visible-light based solar heating of buildings and window end-users, as well as discomfort from increased glare, will not be substantially reduced on such days. Electrochromic windows, on the other hand, allow the degree of VLT to be altered, permitting users to control visible-light based solar heating and glare on sunny days, or for privacy reasons.

Electrochromic windows, of all types, have a number of limitations, however, that are currently preventing their large-scale commercial application. Because electrochromic windows rely on electricity to switch their states from high-to-low VLT and vice-versa, such windows must be directly tied into the building infrastructure. This significantly increases the cost of implementing electrochromic windows, even though the total electricity usage and costs are minimal. Furthermore, electrochromic windows do not generally absorb IR light, so they do not prevent a major source of solar heating of buildings and users, and thus require further 'low-e' coatings to control IR transmission.

SUMMARY OF THE INVENTION

The present invention recognizes that combining SolarWindow™ and electrochromic windows can simultaneously combine the advantages and mitigate the limitations of the two technologies when they are implemented separately. A combined SolarWindow™-Electrochromic window could serve to provide a completely self-contained unit that does not require external power to provide VLT switching, reducing installation costs substantially. Alternatively, such an integrated window could still be tied into the building infrastructure, but actually contribute power to the building, either through a local microgrid or the larger grid, offsetting the increased installation costs over time. Additionally, the SolarWindow™ component would absorb IR light, thus minimizing user and building heating, significantly reducing HVAC costs and mitigating one of the main drawbacks of current electrochromic window technologies.

Conventional attempts to integrate photovoltaic and electrochromic devices have a number of differences and disadvantages compared to the exemplary embodiments of SolarWindow™-Electrochromic window integration described herein. A large majority of such conventional art is based upon semi-transparent inorganic thin-film photovoltaic cells (e.g. US5377037, US 2011/0286071 A1), the most common of which is amorphous silicon (Si). The absorbing layers in such thin-film cells are generally on the order of 1-5 µm thick, and as such, generally have very low VLT, making for poor windows for most applications. Furthermore, semitransparent amorphous Si photovoltaic cells have a very unattractive blood red color, making for poor aesthetics that will likely preclude widespread adoption by architects and end-users alike.

In some cases, the conventional art propose using alternative electrochromic technologies, such as electrochromic solutions (e.g. U.S. Pat. No. 8,188,361), rather than solid-state thin-film electrochromics, to reduce the driving voltage requirements and allow using thinner thin-film photovoltaic cells. Such techniques have drawbacks, however, such as the inherent difficulties in encapsulating liquid-phase systems to ensure long-lifetime products, and operating the photovoltaic cells at much less than optimal power generation conditions hampering any potential power production. Another common technique used in the conventional art is placing traditional crystalline Si photovoltaic cells along just the edges of an electrochromic window frame (e.g. U.S. Pat. No. 5,384,653, EP0669012A4). Such an installation is prone to shading issues, however, where obstructions such as clouds, trees, dirt, etc. may occlude just the photovoltaic cell, preventing darkening of the electrochromic window, while still subjecting the user to excessive glare.

None of the known conventional art proposes to utilize semitransparent organic photovoltaic solar cells, such as used in SolarWindow™, to power and control electrochromic windows. In contrast to the low VLT and poor aesthetics of semi-transparent inorganic thin-film photovoltaics, organic photovoltaic cells generally have absorbing layers on the order of 100-200 nm thick, and, as such, SolarWindow™ products can have VLT values as high as 60%. Furthermore, the uniquely tunable nature of organic photovoltaics, as compared to other photovoltaic technologies, allows the absorption properties to be altered to provide attractive aesthetics such as neutral green, blue, and gray colors, which can be tuned specifically to the customer's request. The limited width of the absorption band of organic molecules provides another unique advantage over thin-film technologies for window and specifically photovoltaic-electrochromic window technologies; inorganic thin-film semiconductors absorb essentially all wavelengths of light above their bandgap, meaning a low-bandgap inorganic thin-film absorber material will absorb essentially all visible light.

Organic materials, on the other hand, can have low bandgaps, allowing them to absorb IR radiation, while their narrow absorption band also limits absorption of the visible spectrum. As a result, organic photovoltaic cells such as in SolarWindow™ can absorb some or all of the IR spectrum, generating electricity from those photons and preventing solar heating of the building, reducing HVAC costs and increasing user comfort on bright, hot days, while simultaneously retaining high VLT values.

Another major potential advantage of using semitransparent organic photovoltaic cells, and SolarWindows™ specifically, as opposed to inorganic thin-film photovoltaic cells for powering and controlling electrochromic windows is cost. SolarWindow™ is completely compatible with large-scale manufacturing using atmospheric pressure, low-temperature, solution-based coating processing technologies, including large-area sheet-to-sheet and especially roll-to-roll manufacturing techniques. These techniques lend themselves to significantly lower cost manufacturing (due to lower capital and operating expenses) as compared to inorganic thin-film manufacturing that generally relies on high temperature and low pressure manufacturing techniques. As cost is a major area of concern for making electrochromic windows commercially viable, minimizing the cost of the photovoltaic portion of any integrated photovoltaic-electrochromic window unit is critical to ensure commercial success.

The present invention recognizes that conventional electrochromic windows suffer from high installation costs, due to their required integration with the building electrical infrastructure, and generally do not limit IR-based solar heating of buildings and users. Conventional methods to integrate photovoltaic cells or windows to power and control electrochromic windows generally rely either on traditional crystalline Si photovoltaic cells placed along window edges, which may suffer from shading effects, or on semitransparent inorganic thin-film photovoltaic cells, which suffer from numerous drawbacks, including: low VLT, poor aesthetics, high costs, and an inability to control IR transmission.

Organic photovoltaic-based SolarWindows™ have numerous advantages when implemented alone, including: power generation, high VLT, attractive aesthetics, IR absorption, and potentially low costs, however the static VLT does not provide for glare control for user comfort or substantially reduce visible-light based solar heating on hot, sunny days.

These problems and others are addressed by the present invention, a first exemplary embodiment of which comprises a two-pane insulated glass window unit (IGU), wherein the outermost (sun-ward) pane is coated on the inside of the IGU with a organic photovoltaic module (SolarWindow™), comprising one or more cells connected in series and/or parallel. The innermost pane is coated on the inside of the IGU with a single-polarity electrochromic window, comprised of any of a number of different materials, including but not limited to $WO_3$, $MoO_3$, $TiO_2$, $U_2O_x$, $Bi_2O_3$, $PbO_2$, and $CuO_x$. The two panes are connected via wires such that the voltage produced by the SolarWindow™ when illuminated can drive the electrochromic window into the low VLT ('dark') state. In this exemplary embodiment, the unit is entirely self-contained, with no user control, such that when illuminated the SolarWindow™ darkens the electrochromic window, and when illumination is removed and the photovoltage dissipates, the electrochromic window slowly returns to the high VLT state. In this exemplary embodiment, the intensity of illumination on the SolarWindow™ can control the degree to which the electrochromic window darkens, providing for various light conditions. In this exemplary embodiment, the wires connecting the photovoltaic and electrochromic elements may be electronically controlled to automatically open the circuit and prevent over-driving of the electrochromic window once it reaches the fully dark low VLT state. The wires may also be electronically controlled to allow short-circuiting across the electrochromic element to speed up the bleaching process.

This exemplary embodiment has several advantages over the prior art and solves a number of problems associated with electrochromic windows in general: 1) This exemplary embodiment comprises a totally self-contained IGU that can be dropped in place for new construction or retrofits, eliminating the need for costly wiring connection to the building infrastructure. 2) The SolarWindow™ absorbs IR light, converting it into electricity to drive the electrochromic window, reducing IR-based solar heating of users and buildings, thereby increasing user comfort and reducing building HVAC, unlike for inorganic thin-film based technologies. 3) The high VLT and attractive aesthetics of SolarWindow™ ensure the photovoltaic-electrochromic IGU has an attractive appearance and a high VLT in the transmissive state, unlike for inorganic thin-film based technologies. 4) In this exemplary embodiment, the unit is completely self-controlled, varying the level of darkening based on the degree of sun exposure and requiring no user input, making it ideal for windows that would be inconveniently placed for direct user control. The full window area of the photovoltaic SolarWindow™ element ensures that partial shading will not prevent the window from actuating, unlike in the case of edge-cell based technologies. 5) The potentially low costs of the low-temperature, atmospheric pressure, high-throughput manufacturing of SolarWindow™ should help keep the overall cost of the IGU low enough to be competitive, unlike for inorganic thin-film based technologies.

Another exemplary embodiment of the invention comprises a two-pane insulated glass window unit (IGU), wherein the outermost (sun-ward) pane is coated on the inside of the IGU with a organic photovoltaic module (SolarWindow™), comprising one or more cells connected in series and/or parallel. The innermost pane is coated on the inside of the IGU with a single-polarity electrochromic window. The two panes are connected via wires such that the voltage produced by the SolarWindow™ when illuminated can drive the electrochromic window into the low VLT state. In this exemplary embodiment, the unit is wired in such a way to include manual controls (physical and/or electronic in nature) and a battery in parallel that can allow the electrochromic element to be driven to the dark state even in the absence of a photovoltage. When the photovoltaic power is not needed to drive a change in the electrochromic element, or if the user wishes to prevent darkening even under full sun conditions, it can be used to charge the battery. The battery may also be used to speed the bleaching process of the electrochromic element, through the use of a polarity inverter. In this exemplary embodiment, in addition to the advantages of this technology described above, another advantage is retaining full user control of the degree of VLT.

Another exemplary embodiment of the invention comprises a two-pane insulated glass window unit (IGU), wherein the outermost (sun-ward) pane is coated on the inside of the IGU with a organic photovoltaic module (SolarWindow™), comprising one or more cells connected in series and/or parallel. The innermost pane is coated on the inside of the IGU with a single-polarity electrochromic window, comprised of any of a number of different materials, including but not limited to $WO_3$, $MoO_3$, $TiO_2$, $U_2O_x$, $Bi_2O_3$, $PbO_2$, and $CuO_x$. The two panes are connected via wires such that the voltage produced by the SolarWindow™ when illuminated can drive the electrochromic window into the low VLT state. In this exemplary embodiment, however, the unit is also wired into the building infrastructure and includes manual controls (physical and/or electronic in nature) that can allow the electrochromic element to be driven to the dark state even in the absence of a photovoltage using building power. The user may also prevent darkening in full solar exposure, if so desired, thus retaining full control over the VLT of the system. When the photovoltaic power is not needed to drive a change in the electrochromic element, automatic and/or manual controls allow it to provide power to the building environment, either in the form of a local microgrid, or by connection to the full grid infrastructure using appropriate inverter technologies. In this exemplary embodiment, while additional expenses are incurred during the installation processes, the excess power generated by the SolarWindow™ can be used to offset other building power needs or sold to the grid, recuperating those costs over time.

A further exemplary embodiment of the invention comprises a flexible plastic film with the organic photovoltaic component (SolarWindow™) coated monolithically on top of the electrochromic component, comprised of any of a number of different materials, including but not limited to $WO_3$, $MoO_3$, $TiO_2$, $U_2O_x$, $Bi_2O_3$, $PbO_2$, and $CuO_x$, directly on the flexible and transparent substrate. In such an exemplary embodiment, a common transparent conducting electrode connects the organic photovoltaic cell(s) (anode) and the electrochromic device (cathode), while a wire connects the photovoltaic cathode with the electrochromic anode, incorporating manual controls (physical and/or electronic in nature) that allow users to maintain a high VLT state even in bright conditions. An optional battery and associated switching elements could also allow darkening under low-light conditions. Such an exemplary embodiment would allow the product to be applied to existing windows, opening up large market segments, as the high cost of window replacement could be avoided.

One of the major benefits of organic photovoltaic technology over thin-film photovoltaic technology in this exemplary embodiment is the tunable nature of organic photovoltaics. Whereas in thin-film cells the open-circuit voltage ($V_{OC}$) is largely set by the nature of the inorganic material, the $V_{OC}$ of organic photovoltaic cells can be tuned by altering the chemical structure of the donor and/or acceptor materials in the absorber layer. The $V_{OC}$ of an individual thin-film cell is often not enough to drive common electrochromic materials (e.g. $WO_3$) through their full range of VLT, requiring the fabrication of series interconnected modules. This adds expense and complication to the manufacturing process, particularly for monolithic integration as in this exemplary embodiment. While most organic photovoltaic cells also have limited $V_{OC}$s comparable to those of thin-film cells, a specific organic photovoltaic material could be designed to have a much larger $V_{OC}$, such that an individual cell may have sufficient voltage to drive common electrochromic materials through their full range of VLT. This would greatly simplify the fabrication of a monolithic organic photovoltaic-electrochromic flexible film as described in this exemplary embodiment.

Other features and advantages of the present invention will become apparent to those skilled in the art upon review of the following detailed description and drawings.

BRIEF DESCRIPTION OF THE DRAWINGS

These and other aspects and features of embodiments of the present invention will be better understood after a reading of the following detailed description, together with the attached drawings, wherein.

DETAILED DESCRIPTION OF THE EXEMPLARY EMBODIMENTS OF THE INVENTION

The present invention now is described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Figure 5:
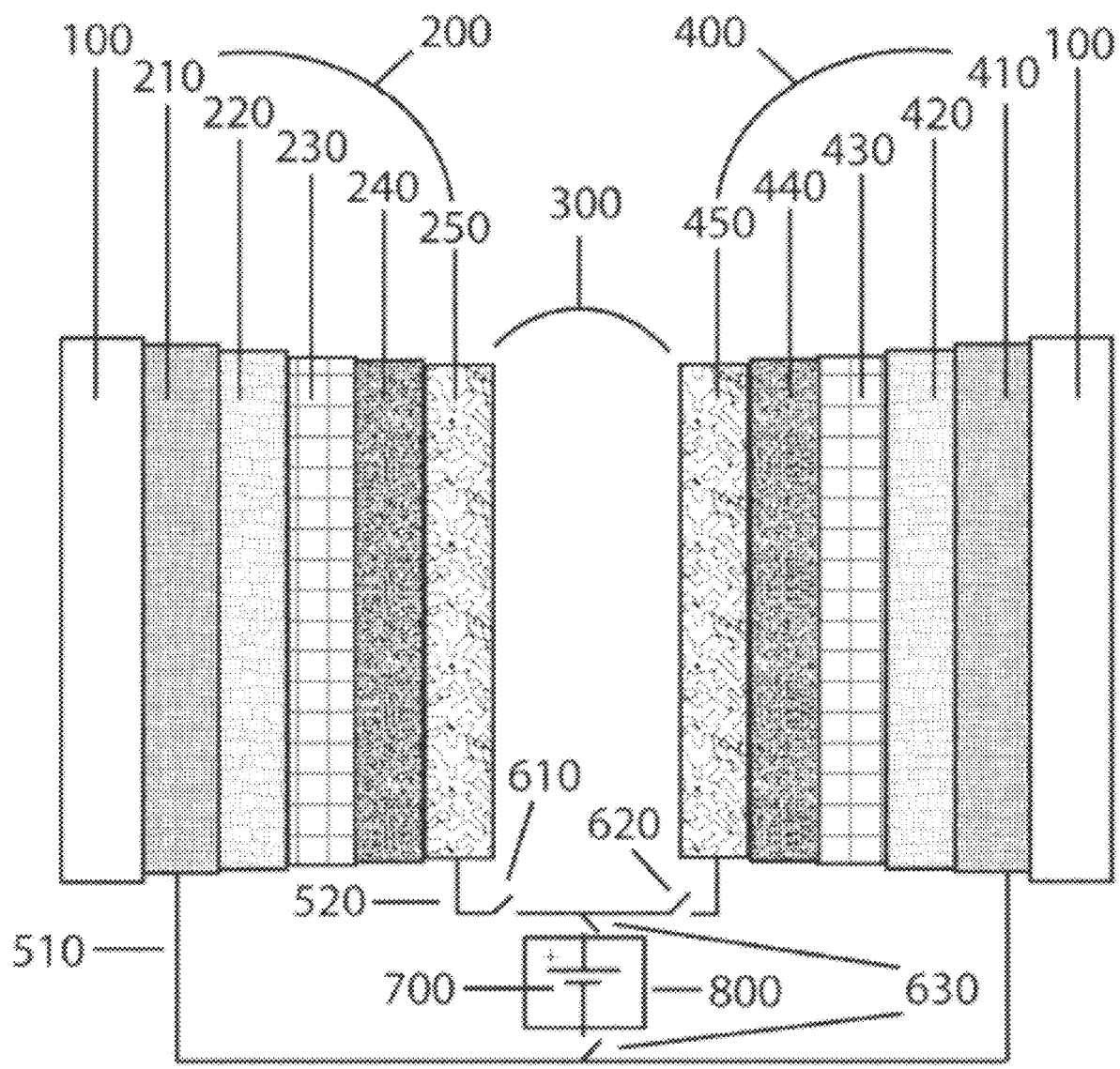
FIG. 5 is a cross-sectional view of an exemplary embodiment of the SolarWindow™-Electrochromic window with a battery and switching elements to allow for a fully user-controllable dynamic energy-saving window system.
Figure 6:
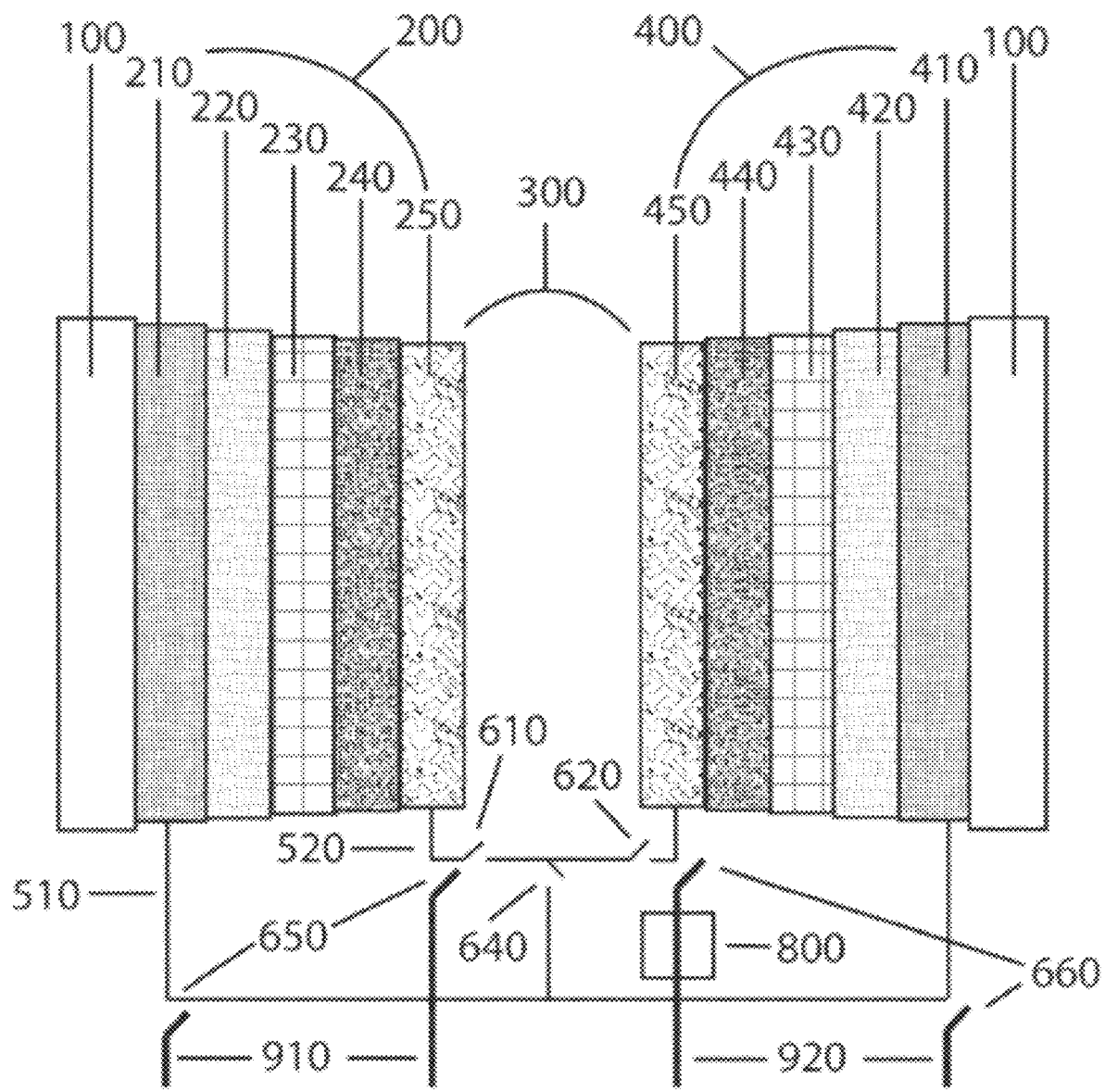
FIG. 6 is a cross-sectional view of an exemplary embodiment of the SolarWindow™-Electrochromic window with switching elements and connection to the building infrastructure to allow for a fully user-controllable dynamic energy-saving window system that can also provide photovoltaic energy to the building.
Figure 7:
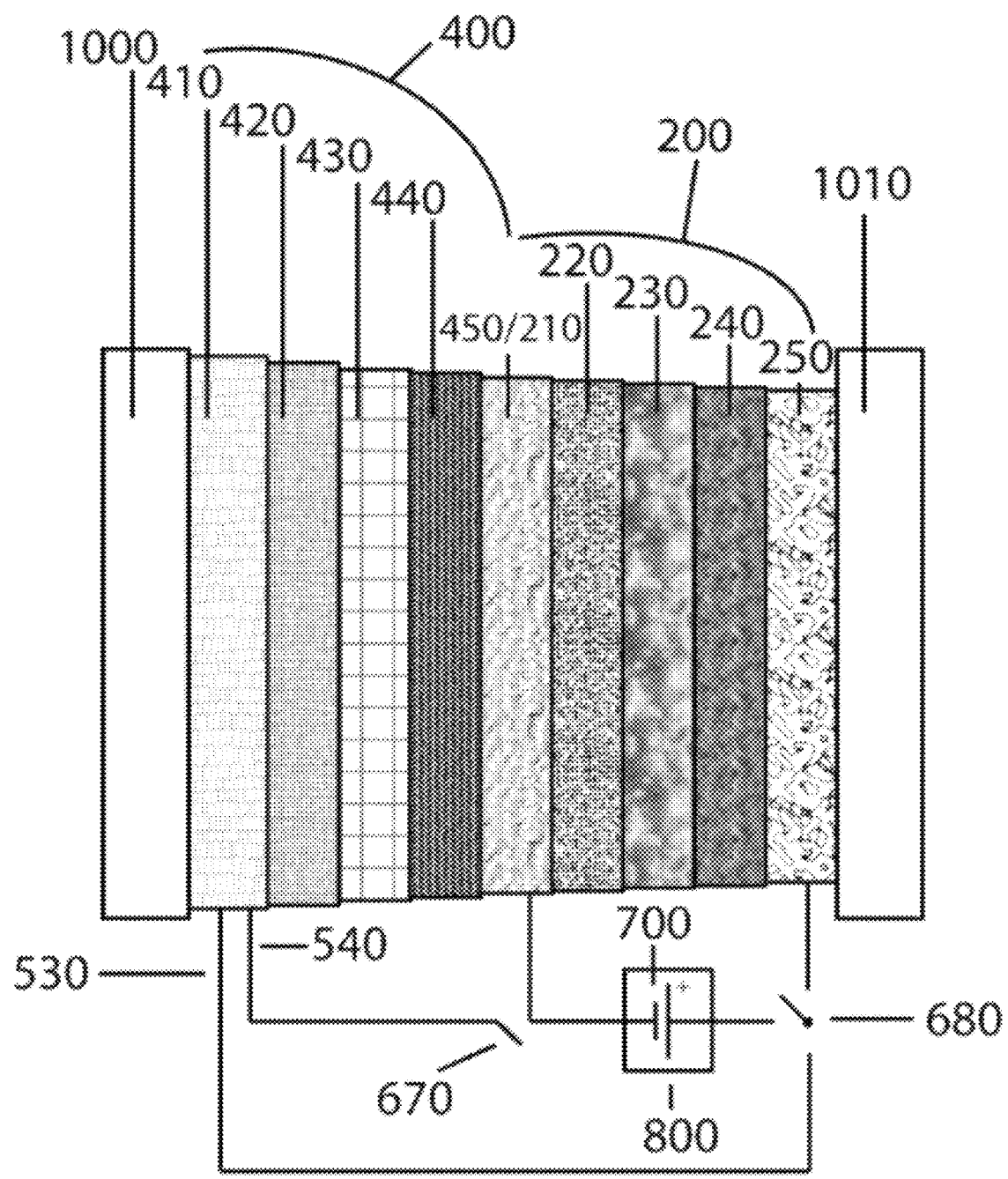
FIG. 7 is a cross-sectional view of an exemplary embodiment of a SolarWindow™-Electrochromic window film, with a battery switching elements to allow for a fully user-controllable dynamic energy-saving window film that can be applied to existing windows in an aftermarket fashion.

Referring now to the drawings, FIGS. 1-7 illustrate exemplary embodiments of a SolarWindow™-Electrochromic window self-powered dynamic energy-saving window (FIGS. 1-6) or window-film (FIG. 7).

Figure 1:
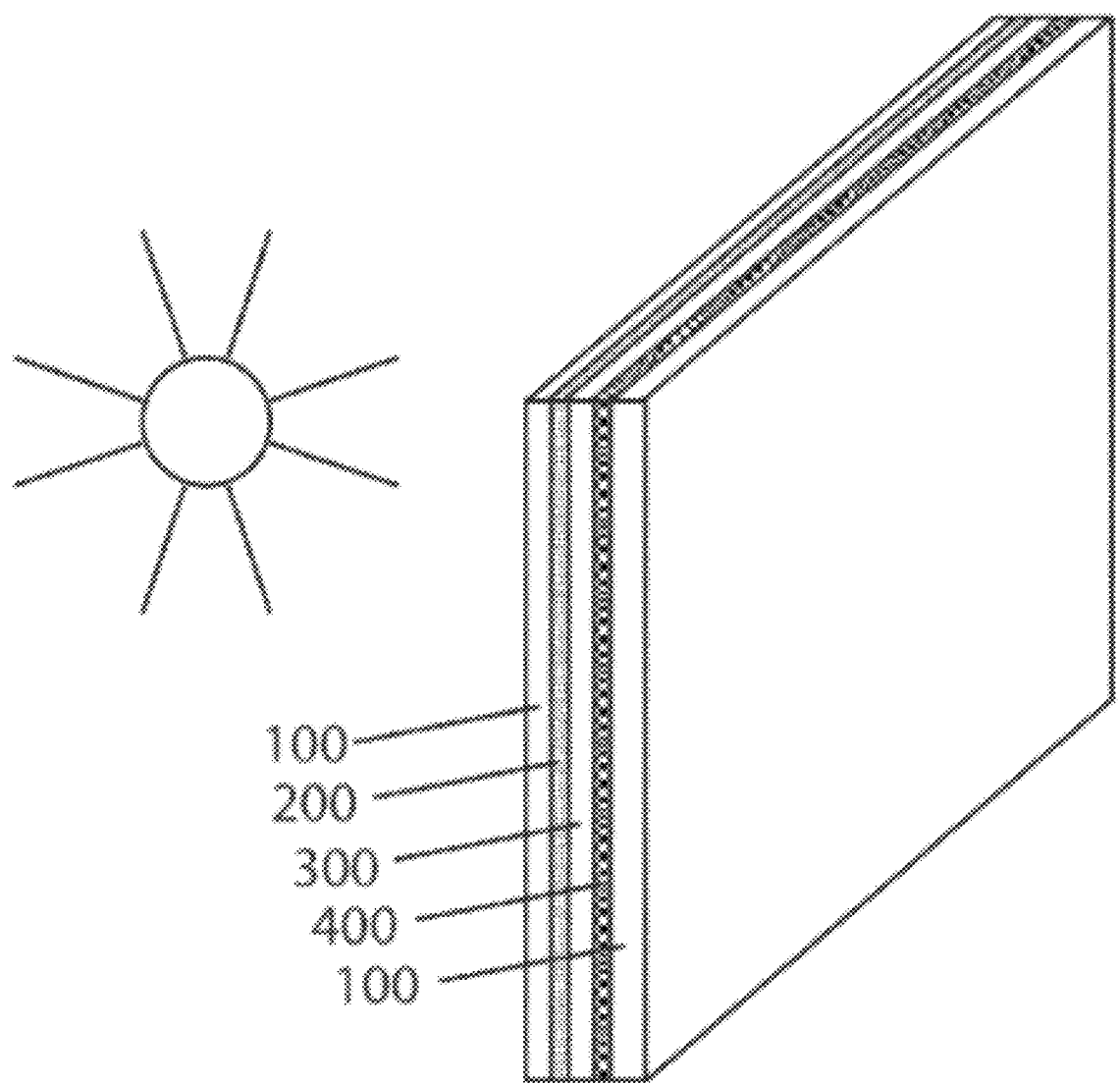
FIG. 1 is a perspective view of the SolarWindow™-Electrochromic dynamic energy-saving window according to an exemplary embodiment of the invention.

Referring to FIG. 1, which provides a perspective view of the overall construction of a SolarWindow™-Electrochromic window, the unit is contained within two panes of glass or other rigid transparent substrate materials 100 that are placed parallel, spaced apart, and sealed such that there is a gap 300, which can contain air, an inert gas such as argon, or a vacuum, to create an insulated glass unit (IGU) or insulated unit (IU). The gap is designed such that heat transfer via conduction and convection is minimized, as will be understood by one of ordinary skill in the art. The organic photovoltaic SolarWindow™ portion of the unit 200 is coated upon one pane of glass or other substrate material 100, which commonly is positioned closest to the sun (or otherwise brightest light source). The electrochromic portion of the unit 400 is coated upon the second pane of substrate 100. In this fashion, when sunlight is incident on the unit, the SolarWindow™ portion converts a portion of the sunlight (or other bright light) into electricity while retaining a high overall VLT, and it can drive the electrochromic portion to a low VLT state, through increased absorption and/or reflection, resulting in lower solar heating of users and buildings to increase user comfort and lower building HVAC costs. The organic photovoltaic-based SolarWindow™ absorbs much of the near-IR light, converting it into electricity, reducing direct solar heating from IR radiation, unlike most inorganic thin-film photovoltaic technologies.

Figure 2:
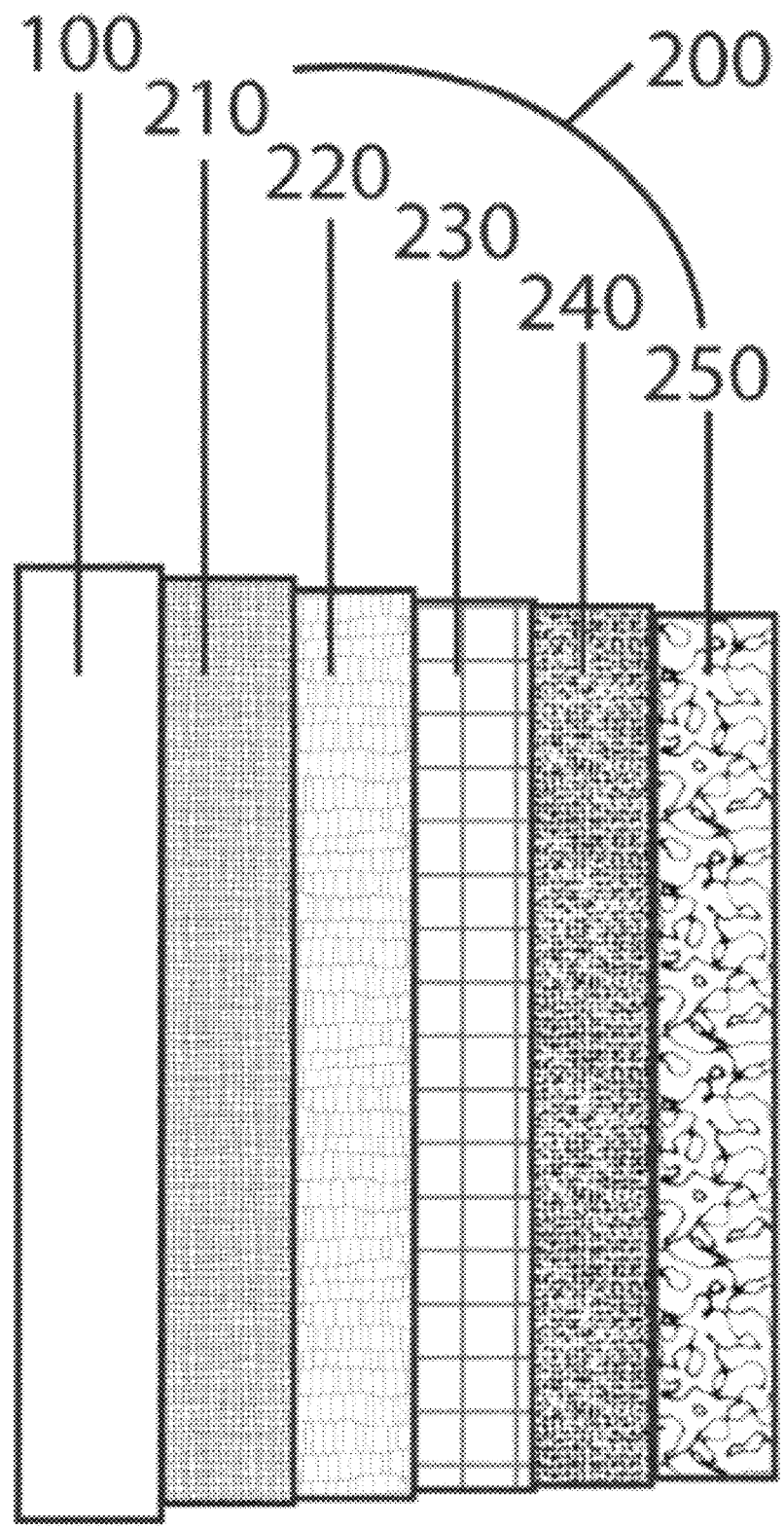
FIG. 2 is a cross-sectional view of the SolarWindow™ portion of the SolarWindow™-Electrochromic window in FIG. 1 according to an exemplary embodiment of the invention.

Referring to FIG. 2, which provides a cross-sectional view of the organic photovoltaic-based SolarWindow™ portion of the unit, 200, the foundational layer of the stack is a transparent conductor 210, which is coated directly on the substrate 100. The transparent conductor can be any of a number of highly conductive yet transparent materials, including but not limited to: doped metal oxides such as indium tin oxide (ITO), aluminum zinc oxide (AZO), gallium zinc oxide (GZO); metallic nanowire meshes such as silver, copper, or carbon nanotube meshes; graphene; or highly doped organic semiconductors such as poly(ethylenedioxythiophene):poly(styrene sulfonate) (PEDOT:PSS). Some of these can be put down using solution-based, low-temperature, atmospheric pressure coating methods that lend themselves to low-cost, high-throughput production methods, while others require high-temperature and/or low-pressure production processes. The next layer is a contact layer 220 that alter the work-function of the transparent contact 210 and facilitates charge selectivity in order to maximize open-circuit voltage ($V_{OC}$) and short-circuit current ($I_{SC}$) from the organic photovoltaic cell(s). This contact layer can be any of a number of materials, including but not limited to: metal oxides such as zinc oxide, titanium oxide, nickel oxide; organic polymeric materials such as PEDOT:PSS, PFN; graphenes such as doped graphenes or graphene oxide; or self-assembled monolayers such as organophosphonic acids or organocarbonic acids. All of these contact layers are potentially compatible with low-cost solution coating methods. The next layer is the bulk heterojunction (BHJ) 230, the heart of an organic photovoltaic cell, which consists of a bicontinuous blend of an organic polymeric or small-molecule absorber/electron donor material and a organic fullerene electron acceptor material, such as phenyl $C_{61}$ butyric acid methyl ester (PCBM) or related materials. By tuning the exact nature of the donor and acceptor materials, the absorption properties, VLT, overall appearance, $V_{OC}$, $I_{SC}$, and more can be altered to meet the requirements of a particular application. The BHJ 230 can be fabricated via low-cost, high-throughput coating methods, which is a significant advantage over inorganic thin-film photovoltaic technologies that generally require high-temperature and/or low-pressure fabrication techniques. The next layer is another contact layer 240, which is necessarily different from the contact layer 220 to ensure orthogonal selectivity for charge carriers, but is selected from the same list materials for contact layers described previously. Those skilled in the art will know how to select both contact layers 220 and 240 appropriately to ensure optimal device operation. The final layer is another transparent contact 250, which is selected from the same list of materials as for 210, and can be the same as, or different from, the material selected for 210. The entire SolarWindow™ stack can be patterned via a variety of methods into one or more cells, arranged in series and/or parallel in order to optimize the $V_{OC}$ and $I_{SC}$ for a given application.

Figure 3:
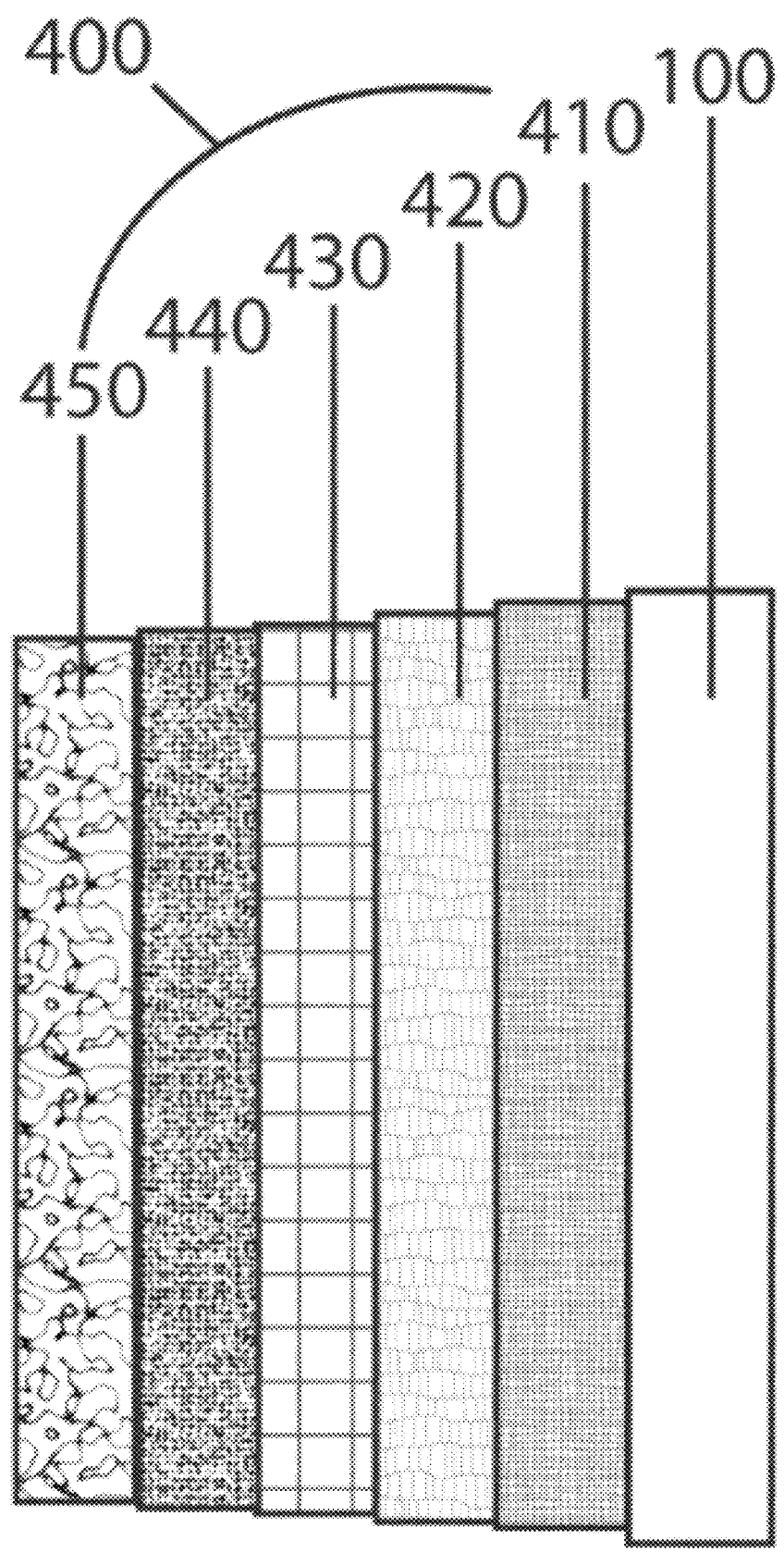
FIG. 3 is a cross-sectional view of the electrochromic portion of the SolarWindow™-Electrochromic window in FIG. 1 according to an exemplary embodiment of the invention.

Referring to FIG. 3, which provides a cross-sectional view of the electrochromic portion of the unit, 400, the foundational layer of the stack is a transparent conductor 410, which is coated directly on the substrate 100. The transparent conductor is selected from the same list of materials as for transparent contacts 210 and 250 in the SolarWindow™ portion of the unit (FIG. 2), and can be the same as, or different from, the materials used in those contacts. The next layer is an electrochromic material 420; that is a material that takes on or losses color, thus varying its VLT, in response to an electric potential or electric current. It can be one of a number of materials, including but not limited to: $WO_3$, $MoO_3$, $TiO_2$, $U_2O_x$, $Bi_2O_3$, $PbO_2$, or $CuO_x$; any of which may be doped with additional lithium ions to improve performance, and most of which color in the reduced state. The preferred material is generally $WO_3$ or $Li_xWO_3$, however, due to its generally superior performance. While most of these materials require high-temperature, low-pressure fabrication methods, $WO_3$ is potentially compatible with low-temperature, atmospheric-pressure fabrication processes as well. The next layer is an ion conductor layer 430, which serves to conduct ions to and from the electrochromic and counter electrode layers (420 and 440, respectively) under charging and discharging conditions. The ionic conductive layer can be one of a number of materials, including but not limited to: liquid electrolytes such as lithium salt solutions, e.g. lithium perchlorate, lithium triflate, etc. in propylene carbonate, acetonitrile, etc. (not generally practical); polymer gels such as polyethylene oxide, polypropylene oxide, or silicones, swelled with lithium salt solutions; or solid thin-film fast-ion conductors such as $Li_3N$, $Li_2NH$, $Li_2O$, $M_xF_y$, $M_xO_y$, $Li_xM_yO_z$, $Li_xM_yF_z$, where M represents a transition metal. The liquid and gel ion conductors can generally be put down via solution methods, whereas the thin-film ion conductors generally require high-temperature and/or low-pressure methods. The next layer is a counter electrode/ion-storage/opposite polarity electrochromic layer 440. This layer may be a complementary electrochromic material, reducing VLT in the oxidized state, such as Prussian blue, $Ni(OH)_2$, $IrO_2$, or $CuO_x$. Alternatively, this layer can be a relatively passive counter electrode/ion-storage layer, such as employed in lithium-ion batteries, which are well-known in the art. The final layer is another transparent conductor layer 450, which is selected from the same list of materials as for 410, 210, and 250; all of which may be identical in nature, or may vary depending on desired material properties.

Figure 4:
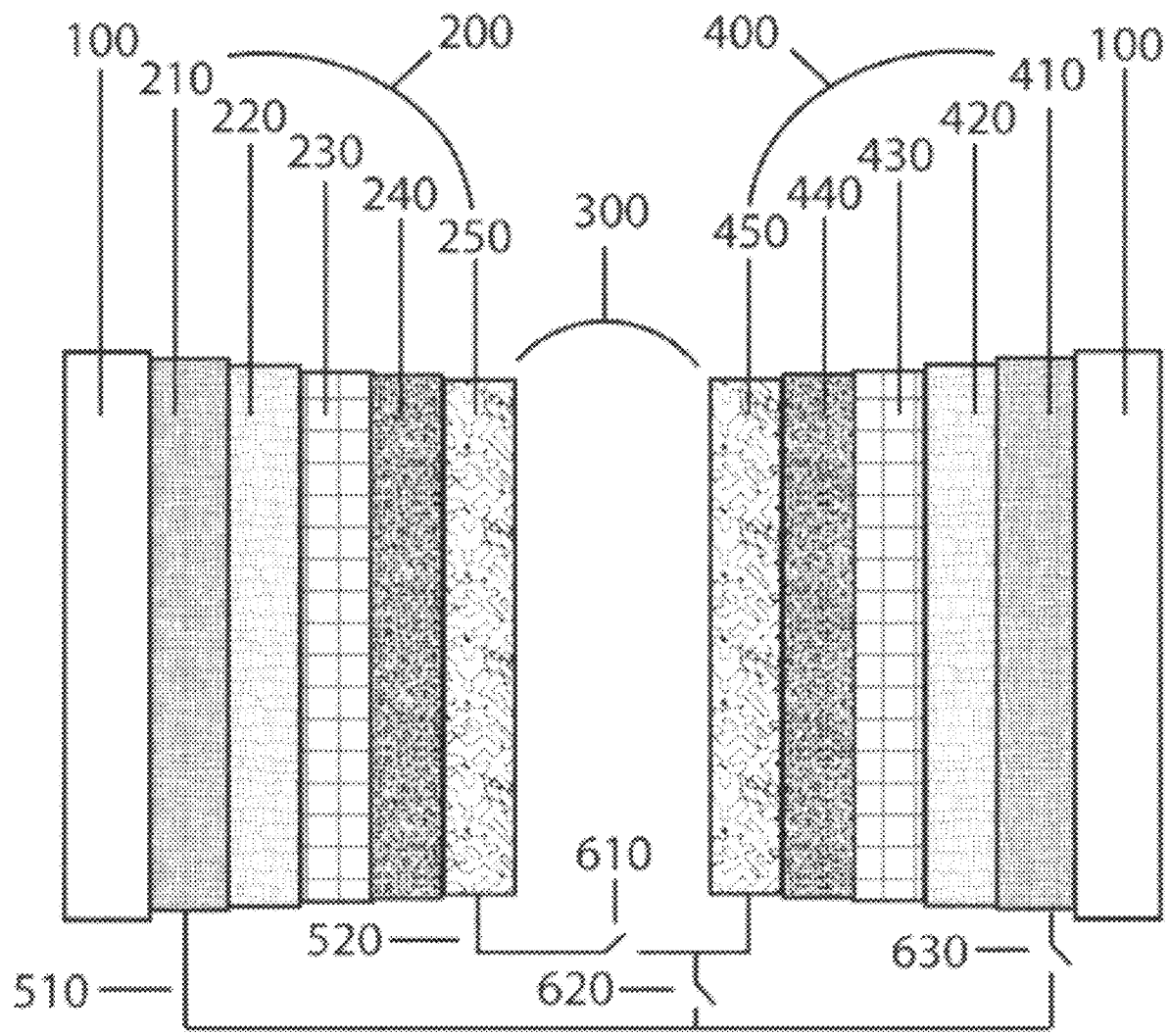
FIG. 4 is a cross-sectional view of an exemplary embodiment of the SolarWindow™-Electrochromic window with switching elements to allow for a completely stand-alone dynamic energy-saving window system.

FIG. 4 demonstrates an exemplary embodiment of a SolarWindow™-Electrochromic window self-powered dynamic energy-saving window, wherein the window is designed to be completely self-contained, self-powered, and self-controlled. In FIG. 4 all of the layers 100-400 are as described above. In this exemplary embodiment, wires 510 and 520 connect the transparent contacts of the photovoltaic SolarWindow™ 200 and electrochromic window 400 portions of the unit to allow the photovoltaic element 200 to power the electrochromic element 400 when the sun shines. The intensity of the sunlight will vary the voltage and current driving the electrochromic element 400, thus providing variable levels of VLT depending on the solar intensity. Electronically controlled switches 610, 620, and 630 allow the circuit between photovoltaic and electrochromic elements to be opened in case the electrochromic element reaches its (pre-determined) lowest VLT state, to prevent overdriving and damage to the electrochromic element. When the solar intensity is reduced, the photovoltage will gradually dissipate and the electrochromic element will slowly return to a high VLT state. Electronically controlled switches 610, 620, and 630 allow the electrochromic element to be short-circuited to speed this process.

FIG. 5 demonstrates an exemplary embodiment of a SolarWindow™-Electrochromic window self-powered dynamic energy-saving window, wherein the window is designed to be completely self-contained and self-powered, but fully user-controllable. In FIG. 5 all of the layers 100-400 are as described above. In this exemplary embodiment, wires 510 and 520 still connect the transparent contacts of the SolarWindow™ 200 and electrochromic 400 window portions of the unit to allow the photovoltaic element 200 to power the electrochromic element 400 when the sun shines. In this exemplary embodiment, however, user-controllable electronic switches 610, 620, and 630 allow the user to control the degree of VLT desired when the sun is shining, by controlling when to open the circuit between the photovoltaic and electrochromic elements. A battery 700 may be charged by the photovoltaic element 200 when no change in VLT is presently desired, or may be used to reduce the VLT even under low solar intensities and/or assist in speed of reduction in VLT. Furthermore, a polarity inverter 800 also allows the battery 700 to drive the electrochromic element 400 in reverse to allow rapid return to a high VLT state.

FIG. 6 demonstrates an exemplary embodiment of a SolarWindow™-Electrochromic window self-powered dynamic energy-saving window, wherein the window is integrated into the building infrastructure, although largely self-powered, fully user-controllable, and also can contribute power to the building (either to a local microgrid or to the larger grid). In FIG. 6 all of the layers 100-400 are as described above. In this exemplary embodiment, wires 510 and 520 still connect the transparent contacts of the SolarWindow™ 200 and electrochromic 400 window portions of the unit to allow the photovoltaic element 200 to power the electrochromic element 400 when the sun shines, and user-controllable electronic switches 610, 620, and 640 still allow user control of the degree of VLT desired by opening the circuit between photovoltaic and electrochromic elements. In this building-integrated embodiment, however, building power lines 910 and 920 connect to the photovoltaic and electrochromic elements through switches 650 and 660, respectively. This allows all the user-control of the battery-assisted embodiment, above, while also adding new capabilities. For example, when no change in VLT is desired, switches 610 and 650 and lines 910 allow the photovoltaic element to provide power to the building, either to a local microgrid, or to the larger grid environment, using appropriate inverter technologies if required (not shown). Building lines 920, along with switches 620, 640, and 660, and polarity inverter 800 allow the building power to assist in: decreasing time to increase or decrease VLT, and provide user control of VLT in low incident solar intensity. Although the installation costs will be higher for integration into building infrastructure, the ability to contribute power back to the local grid will offset those costs over time.

FIG. 7 demonstrates an exemplary embodiment of a SolarWindow™-Electrochromic window self-powered dynamic energy-saving window film, wherein the film can be applied in an after-market fashion to existing windows to create self-contained and self-powered, but fully user-controllable dynamic windows at a fraction of the cost of upgrading to new IGUs/IUs. In FIG. 7 all of the layers 200-400 are as described above, except that layers 210 and 450 are integrated into a single layer, and there is no air gap 300. In this exemplary embodiment, all of the layers are fabricated in a serial fashion on a single substrate (1000 or 1010), which is later laminated with the other substrate, or in parallel on the two substrates that are then laminated together. The substrates 1000 and 1010 can be any of a number of flexible and transparent materials, including but not limited to: thin flexible glasses; polymer foils such as: polyesters polyethylene terephthalate (PET) and polyethylene naphthalate (PEN); polyimides; polycarbonates; acrylates such as polymethylmethacrylate (PMMA); and polyolefins polyethylene and polypropylene. The substrates 1000 and 1010 may be the same or different materials. Additionally, substrates 1000 and 1010 may incorporate water vapor and/or oxygen barrier properties to protect and enhance lifetime of the SolarWindow™-Electrochromic window elements. In this exemplary embodiment, wires 530 and 540 connect the transparent contacts 250, 210/450, and 410 to allow the photovoltaic SolarWindow™ portion 200 to power the electrochromic portion 400 of the window film. User-controllable electronic switches 670 and 680, in concert with battery 700 and polarity inverter 800 allow the same degree of user control as in the above embodiments. An alternative embodiment of the window film may exclude one or more elements, including: the battery 700, the polarity inverter 800, and user controllable switches 680 and 690 to reduce cost and create a non user-controllable window film similar to the first window unit embodiment described above.

The present invention has been described herein in terms of several preferred embodiments. However, modifications and additions to these embodiments will become apparent to those of ordinary skill in the art upon a reading of the foregoing description. It is intended that all such modifications and additions comprise a part of the present invention to the extent that they fall within the scope of the several claims appended hereto.

What is claimed is:

1. A two-pane insulated glass window unit (IGU) comprising:
    an outer pane on a sun-ward side of the window unit;
    an inner pane on an opposite side of the outer pane from the sun-ward side of the window unit;
    wherein the outer pane is coated on an inside surface of the two-pane insulated glass window unit (IGU) with a semitransparent organic photovoltaic module including one or more cells connected in series and/or parallel, and
    wherein the inner pane is coated on an inside surface of the two-pane insulated glass window unit (IGU) with a single-polarity electrochromic element,
    the outer pane and the inner pane being electrically connected such that a voltage produced by the semitransparent organic photovoltaic module, when illuminated, drives the electrochromic element into a low visible light transmission (VLT) state;
    a common transparent conducting electrode layered between the electrochromic element and the semitransparent organic photovoltaic module, the common transparent conducting electrode connecting organic photovoltaic cell(s) (anode) of the semitransparent organic photovoltaic module and an electrochromic device (cathode) of the electrochromic element, a photovoltaic cathode of the semitransparent organic photovoltaic module being electrically connected with an electrochromic anode of the electrochromic element;
    a power source; and
    a polarity inverter between the power source and the single-polarity electrochromic element.

2. The two-pane insulated glass window unit (IGU) of claim 1, further comprising manual controls, wherein the power source is a battery such that the two-pane insulated glass window unit (IGU) is configured to be completely self-contained and self-powered.

3. The two-pane insulated glass window unit (IGU) of claim 2, wherein the outer pane and the inner pane are electrically connected and include the manual controls and the battery in parallel such that the single-polarity electrochromic element can be driven to a dark state in an absence of a photovoltage using power from the battery.

4. The two-pane insulated glass window unit (IGU) of claim 2, wherein the semitransparent organic photovoltaic module charges the battery.

5. The two-pane insulated glass window unit (IGU) of claim 2, wherein the polarity inverter is configured to enable the battery to be used to speed a bleaching process of the single-polarity electrochromic element.

6. The two-pane insulated glass window unit (IGU) of claim 2, wherein the power source further includes a building power line.

7. The two-pane insulated glass window unit (IGU) of claim 6, further comprising automatic controls,
wherein the power source is a battery, and
wherein the outer pane and the inner pane are electrically connected and include the automatic controls and the building power line in parallel such that the single-polarity electrochromic element can be driven to a dark state in an absence of a photovoltage using building power and the two-pane insulated glass window unit (IGU) can be configured to be self-contained and self-powered.

8. The two-pane insulated glass window unit (IGU) of claim 1, wherein the power source includes a building power line.

9. The two-pane insulated glass window unit (IGU) of claim 8, wherein the polarity inverter is configured to enable the semitransparent organic photovoltaic module to supply power to the building power line in order to provide power to one of a building, a local microgrid, and a power grid.

10. The two-pane insulated glass window unit (IGU) of claim 8, wherein the polarity inverter is configured to enable power from the building power line to be used to speed a bleaching process of the single-polarity electrochromic element.

11. The two-pane insulated glass window unit (IGU) of claim 8, further comprising manual controls,
wherein the outer pane and the inner pane are electrically connected and include the manual controls and the building power line in parallel such that the single-polarity electrochromic element can be driven to a dark state in an absence of a photovoltage using building power.

12. The two-pane insulated glass window unit (IGU) of claim 8, further comprising automatic controls,
wherein the outer pane and the inner pane are electrically connected and include the automatic controls and the building power line in parallel such that the single-polarity electrochromic element can be driven to a dark state in an absence of a photovoltage using building power.

13. A flexible plastic film comprising:
a flexible and transparent substrate;
an electrochromic component;
a semitransparent organic photovoltaic component coated monolithically on top of the electrochromic component;
a common transparent conducting electrode layered between the electrochromic component and the semitransparent organic photovoltaic component, the common transparent conducting electrode connecting organic photovoltaic cell(s) (anode) of the semitransparent organic photovoltaic component and an electrochromic device (cathode) of the electrochromic component, a photovoltaic cathode of the semitransparent organic photovoltaic component being electrically connected with an electrochromic anode of the electrochromic component;
a power source; and
a polarity inverter between the power source and the electrochromic component.

14. The flexible plastic film of claim 13, wherein the power source includes a battery,
the flexible plastic film further comprising one or more switching elements,
wherein the electrochromic component is configured to be driven to a dark state by the battery in an absence of a photovoltage.

15. The flexible plastic film of claim 13, wherein the power source includes a battery,
the flexible plastic film further comprising one or more switching elements,
wherein the semitransparent organic photovoltaic component charges the battery.

16. The flexible plastic film of claim 13, wherein the electrochromic component includes:
a first transparent conductor layer on the flexible and transparent substrate;
an electrochromic material on the first transparent conductor layer;
an ion conductor layer on the electrochromic material;
a counter electrode layer on the ion conductor layer; and
a second transparent conductor layer on the counter electrode layer,
the second transparent conductor layer forming the common transparent conducting electrode; and
wherein the semitransparent organic photovoltaic component includes:
a first contact layer on the second transparent conductor layer of the electrochromic component;
a bulk heterojunction (BHJ) on the first contact layer;
a second contact layer on the bulk heterojunction; and
a third transparent conductor layer on the second contact layer.

17. The flexible plastic film of claim 13, wherein the power source includes a power line configured to be connect to a building power line,
the flexible plastic film further comprising one or more switching elements,
wherein the electrochromic component is configured to be driven to a dark state by power supplied by the power line in an absence of a photovoltage.

18. The flexible plastic film of claim 13, wherein the power source includes a power line configured to be connect to a building power line,
the flexible plastic film further comprising one or more switching elements,
wherein the polarity inverter is configured to enable the semitransparent organic photovoltaic component to supply power to the building power line in order to provide power to one of a building, a local microgrid, and a power grid.

19. The flexible plastic film of claim 13, wherein the polarity inverter is configured to enable power from a building power line to be used to speed a bleaching process of the electrochromic component.

20. A flexible plastic film comprising:
a flexible and transparent substrate;
an electrochromic component;
a semitransparent organic photovoltaic component coated monolithically on top of the electrochromic component;
a common transparent conducting electrode layered between the electrochromic component and the semitransparent organic photovoltaic component, the common transparent conducting electrode connecting organic photovoltaic cell(s) (anode) of the semitransparent organic photovoltaic component and an electrochromic device (cathode) of the electrochromic component, a photovoltaic cathode of the semitransparent organic photovoltaic component being electrically connected with an electrochromic anode of the electrochromic component; and
a polarity inverter connected to the electrochromic component.

21. The flexible plastic film of claim 20, further comprising:
a power source including a battery connected to the polarity inverter, the flexible plastic film further comprising one or more switching elements, wherein the electrochromic component is configured to be driven to a dark state by the battery in an absence of a photovoltage.

22. The flexible plastic film of claim 13, further comprising:
a power source including a power line configured to be connect to a building power line, the flexible plastic film further comprising one or more switching elements, wherein the electrochromic component is configured to be driven to a dark state by power supplied by the power line in an absence of a photovoltage.

23. The flexible plastic film of claim 13, further comprising:
a power source including a power line configured to be connect to a building power line, the flexible plastic film further comprising one or more switching elements, wherein the polarity inverter is configured to enable the semitransparent organic photovoltaic component to supply power to the building power line in order to provide power to one of a building, a local microgrid, and a power grid.

24. The flexible plastic film of claim 20, wherein the electrochromic component includes:
a first transparent conductor layer on the flexible and transparent substrate;
an electrochromic material on the first transparent conductor layer;
an ion conductor layer on the electrochromic material;
a counter electrode layer on the ion conductor layer; and
a second transparent conductor layer on the counter electrode layer,
the second transparent conductor layer forming the common transparent conducting electrode; and
wherein the semitransparent organic photovoltaic component includes:
a first contact layer on the second transparent conductor layer of the electrochromic component;
a bulk heterojunction (BHJ) on the first contact layer;
a second contact layer on the bulk heterojunction; and
a third transparent conductor layer on the second contact layer.

* * * * *